United States Patent [19]

Moore

[11] 3,961,290
[45] June 1, 1976

[54] PROGRAMMABLE PHASE CODED SURFACE WAVE DEVICE

[75] Inventor: Samuel D. Moore, Plano, Tex.

[73] Assignee: Texas Instruments Incorporated, Dallas, Tex.

[22] Filed: Feb. 7, 1975

[21] Appl. No.: 547,900

[52] U.S. Cl. .......................... 333/30 R; 179/1.5 E; 310/9.8; 333/72; 340/347 AD
[51] Int. Cl.² ..................... H03H 9/26; H03H 9/30; H03H 9/32; H03K 13/02
[58] Field of Search............ 333/72, 30 R; 29/25.35; 235/181; 310/8, 8.1, 8.2, 9.7, 9.8; 340/347 AD, 347 DA, 173.2; 325/32–34, 30; 179/1.5 E, 1.5 FS

[56] References Cited
UNITED STATES PATENTS

| | | | |
|---|---|---|---|
| 3,551,837 | 12/1970 | Speiser et al. | 333/30 R |
| 3,675,052 | 7/1972 | Lindsay et al. | 310/8.1 |
| 3,680,007 | 7/1972 | Tseng | 333/30 R |
| 3,681,579 | 8/1972 | Schweitzer | 235/181 |
| 3,701,147 | 10/1972 | Whitehouse | 333/30 R X |
| 3,736,587 | 5/1973 | Bush et al. | 333/72 X |
| 3,800,248 | 3/1974 | Speiser et al. | 333/30 R |
| 3,805,195 | 4/1974 | Miller | 333/30 R |
| 3,831,116 | 8/1974 | Davis, Jr. et al. | 333/72 |

*Primary Examiner*—Alfred E. Smith
*Assistant Examiner*—Marvin Nussbaum
*Attorney, Agent, or Firm*—Harold Levine; James T. Comfort; William E. Hiller

[57] ABSTRACT

A surface wave device (SWD) programmable to produce any one of a plurality of phase coded SWD digital delay line configurations from a single transducer pattern characterized by parallel transducer electrode arrays to provide for each of two opposite phase alternatives of acoustic surface waves being propagated. Each transducer comprises pairs of interdigital taps, each tap characterizing a single binary bit. Transducer phase coding is accomplished by severing in selected taps all metalized fingers of like polarity from their common conductor bar. Critical configuration tolerances prohibitive to programmed operations are thus obviated.

12 Claims, 5 Drawing Figures

U.S. Patent June 1, 1976 3,961,290
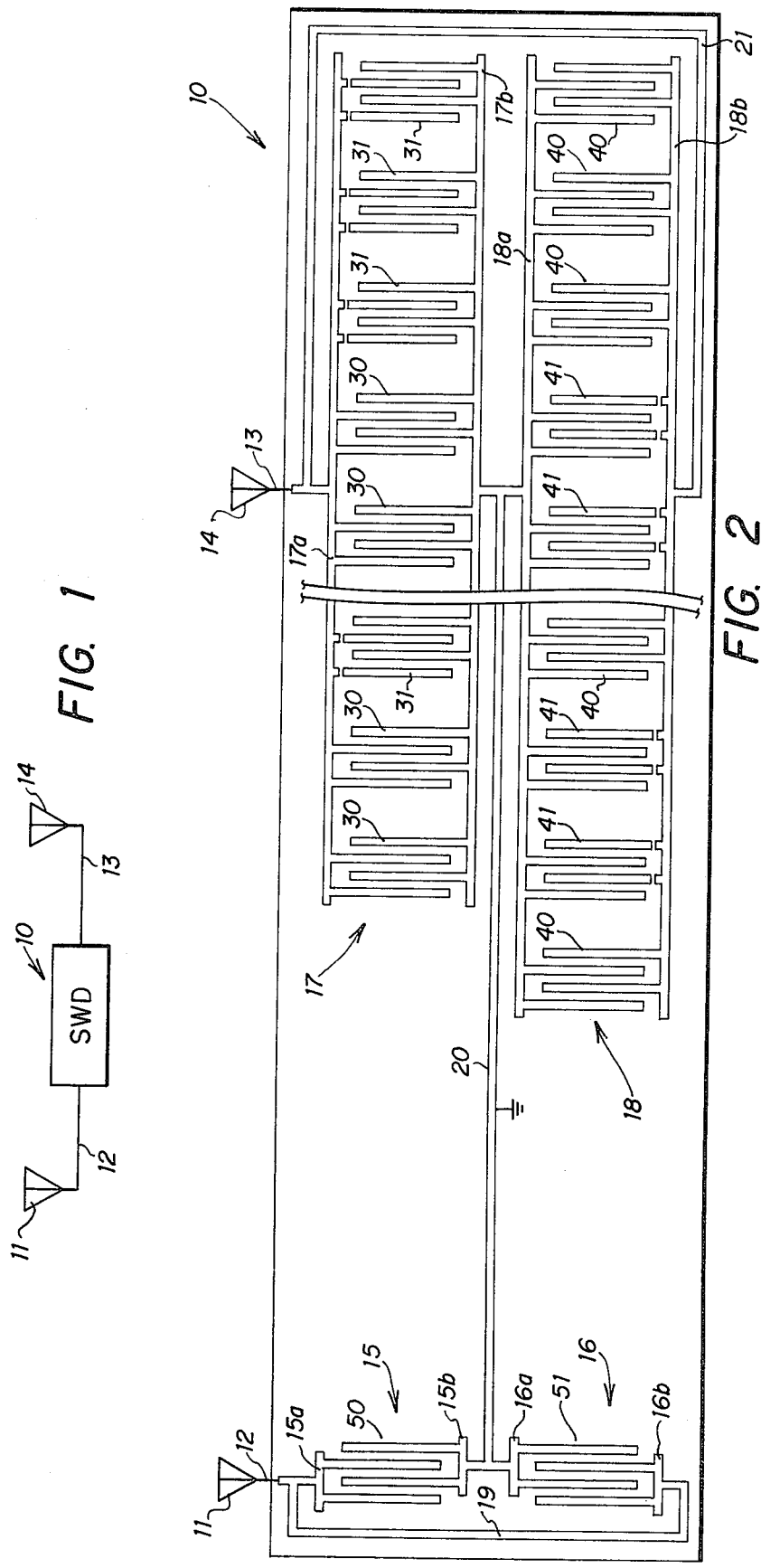

posed between a receiving antenna 11 and a transmitter antenna 14. This system forms a coded transponder. More particularly, receiving antenna 11 is connected by way of a channel 12 to the input of PSK SWD 10, the output of which is connected by way of a channel 13 to transmitter antenna 14.

An incoming signal by way of example may be a linear FM or "chirp" signal. It may comprise 2 or 3 sine wave cycles of high frequency. The incoming signal is received by antenna 11 and applied along channel 12 to the SWD 10. In response thereto, a phase coded signal is generated by SWD 10 and applied to transmitter antenna 14 by way of channel 13. Thus, upon receiving a signal, SWD 10 generates a coded signal which is transmitted by antenna 14. The coded signal may uniquely identify an article, vehicle or location with which SWD 10 is associated.

FIGURE 2

A more detailed illustration of an embodiment of SWD 10 is shown in FIG. 2. Each phase alternative is characterized by one of two parallel transducer configurations. More particularly, an input transducer 15 acts in combination with a coded output transducer 17, and an input transducer 16 acts in combination with a coded output transducer 18 to form a biphase SWD.

An upper conductive bar 15a of transducer 15 is connected by way of a bus 19 to a lower conductor bar 16b of transducer 16, and by way of channel 12 to receiving antenna 11. In addition, a lower conductive bar 15b of transducer 15 is connected to both an upper conductive bar 16a of transducer 16 and to an electrode 20 at ground potential.

Electrode 20 in turn is connected to a lower conductive bar 17b of a transducer 17 and to an upper conductive bar 18a of a transducer 18. Further, an upper conductive bar 17a of transducer 17 is connected by way of an electrode path 21 to a lower conductive bar 18b of transducer 18. Bar 17a is also connected by way of channel 13 to transmitting antenna 14.

In FIG. 2, metalized fingers extend transversely from the bars 15a, 15b, 16a, 16b, 17a, 17b, 18a and 18b of transducers 15–18. The fingers are clustered in groups of four, with each group constituting a single interdigitated bit tap. Input transducers 15 and 16 thus are dual tap transducers comprising taps 50 and 51, respectively. Transducer 17 has four active taps 30 interspersed with as many disabled taps 31 to effect phase reversals in an electrical output signal. Similarly, transducer 18 comprises active taps 40 and selectively disabled taps 41. Each of the taps of transducer 17 are paired in space with a tap from transducer 18.

In accordance with the invention, taps 31 and 41 are disabled one per pair by severing metalized fingers of like polarity from their common conductor bar. By this means, transducers 17 and 18 are coded tap by tap rather than by individual finger alterations.

In operation, an RF signal is received by antenna 11 and applied by way of channel 12 and electrode 19 to input transducers 15 and 16. Electric fields thus generated in the piezoelectric substate between the interdigital fingers of each transducer cause corresponding strains in the surface of the substrate underlying each signal tap. These strains propagate away from the taps of transducers 15 and 16 in the form of acoustic Rayleigh waves, which are sampled by taps 30 and 40 of coded transducers 17 and 18, respectively. The outputs of transducers 17 and 18 are then combined by way of electrode path 21 and channel 13 for use as a uniquely coded signal.

FIGURES 3a–3c

To more clearly illustrate the phase relationships involved in the operation of the transducer configuration of FIG. 2, reference is made to the impulse response diagrams of FIGS. 3a–3c.

The simplest, most direct method for evaluating matched filters is to observe their impulse response, which is a time-reversed copy of the corresponding input signal. To simulate an impulse, a pulse narrower than one half cycle of the center frequency is used. Such a signal is represented in FIG. 3a by a wave in envelope 60 applied by way of channel 12 and path 19 to transducers 15 and 16, respectively.

Since the fingers of taps 50 and 51 are alternately connected to the upper and lower conductor bars of transducers 15 and 16, respectively, a signal voltage impressed upon the electrodes causes the strains induced between adjacent fingers to be opposite in phase. The resultant waveforms are illustrated as acoustic waveforms 61 and 62 of FIG. 3a.

Acoustic waveform 61 is induced by transducer 15 and consists of a plurality of pulses, with each pulse having two negative excursions and one positive excursion. By way of contrast, acoustic waveform 62 is generated by transducer 16 and consists of a plurality of pulses having two positive excursions and one negative excursion. Waveforms 61 and 62 have an opposite phase relationship because of the structural difference between transducers 15 and 16.

As an acoustic wave of waveform 61 propagates across the substrate, it is sampled by taps 30 of transducer 17, thereby producing an output electrical signal of waveform 63. Concurrently, an acoustic wave having waveform 62 is sampled by taps 40 of transducer 18 to produce an output electrical signal of waveform 64. Output signals 63 and 64 are then combined by way of electrode path 21 and channel 13. The resultant is then transmitted as a PSK waveform 65 by way of antenna 14. The sudden reversals in polarity caused by disabled taps 31 and 41 divide waveform 65 into segments which may represent a "1" or a "0" in a binary code as illustrated by binary sequence 66, FIG. 3c, wherein a "0" represents a phase reversal.

In accordance with the present invention, there is provided a programmable SWD compatible with automated system tolerance levels to form, from a single master design, transducer electrode masks for a polyphase PSK SWD. By providing pairs of electrode sets at each bit location the spacing are such that electrodes depending from bar 17a or 18b may readily be severed without damage to any operating part of the structure. Each device to be programmed may be manually altered or may be placed in a machine programmed to slice or remove portions of arrays 31 and 41 to render them ineffective. It will be appreciated that antennas 11 and 14 may comprise a single unit serving as both receiver and transmitting antenna. Further, an FM system may be employed as well as the PSK system and may be selected where maximizing input energy in the substrate is desired.

Having described the invention in connection with certain specific embodiments thereof, it is to be understood that further modifications may now suggest themselves to those skilled in the art and it is intended

3,961,290

PROGRAMMABLE PHASE CODED SURFACE WAVE DEVICE

FIELD OF THE INVENTION

The present invention relates to a programmable surface wave device (SWD) to form any one of a plurality of phase coded (SWDs) surface wave devices from a single production unit.

PRIOR ART

Early acoustic devices, called volume-wave devices, made use of either longitudinal or shear waves that passed through the interior of a solid material and were accessible only at the ends of the solid. Such devices had a low wave velocity resulting in compact embodiments, and a low propagation loss making possible high Q acoustic filters. The later development of acoustic surface wave devices made available the additional advantages provided by Rayleigh waves, which are accessible along the surface of a solid rather than only at the ends.

An acoustic surface wave device (SWD) is a passive electro-acoustic device comprising metalized interdigital transducer elements formed on the surface of a piezoelectric substrate, typically either quartz or lithium niobate. Electrical energy is converted into acoustic energy and reconverted into electrical energy by the interaction of the transducer elements with the substrate properties, with most of the acoustic energy being confined to a region within one wavelength of the surface of the substrate.

The acoustic or Rayleigh wave thus generated propagates along the surface of the substrate with a velocity five orders or magnitude smaller than the velocity of electromagnetic waves in free space, thus making available the use of an SWD in digital delay line applications. Because the acoustic surface waves are easily accessible, signals with different delay times may be sampled at intermediate points along their propagation path. Thus, a phase-coded signal may be tapped by various sampling elements of a transducer which are configured to be synchronously additive only when a specifically coded waveform is presented to the transducer. So configured, the transducer is said to constitute a matched filter. Such configurations have found significant use in signal processing wherein a phase coded input signal is applied to an input transducer and, in response, an identification signal is generated by the output transducer.

A further advantage of surface wave devices is the simplicity of the fabrication process for interdigital transducers. Basically, it involves optically polishing a single surface of a piezoelectric substrate, depositing a metal film upon the polished surface, and then forming transducers using standard photolithography techniques such as have been highly developed for the semiconductor industry. The process is inexpensive, highly repeatable, and can be used to produce filters for the VHF and UHF ranges, where other filter technologies have very limited capabilities.

Where production facilities are directed to the manufacture of a wide variety of transducer patterns. however, economy may be improved by producing a single basic pattern that may readily be altered or programmed after basic manufacture rather than manufacturing a multiplicity of different patterns.

Interdigital transducer patterns embodied in phase coded SWDs may comprise numerous spaced taps, each consisting of a few fingers configured to produce phase reversed output signals to effect coding. Prior methods of coding the transducers entailed use of individual photo masks for each code cutting away portions of each finger of each tap of a transducer. The metalized fingers are positioned very close together. Alterations thereof with a scribe, an electron beam or other conventional means necessitated critical tolerance levels prohibitive to an automated system.

The present invention is directed to a method and system compatible with programmable automatic alteration systems by which a transducer electrode mask effectively is altered tap wise rather than finger by finger. The critical tolerance required in cutting each finger of each transducer thus is obviated.

SUMMARY OF THE INVENTION

The present invention is directed to a programmable processor where surface waves are generated in a piezoelectric substrate which is provided with means thereon to produce surface waves of like character in the substrate in two paths. The surface waves in one path are characterized by a phase opposite the waves in the second path. A first output transducer array on the substrate samples the waves in the first path at spaced time points along the first path. The output transducer array on the substrate simultaneously samples the waves in the second path at time points in the second path corresponding to the time points along the first path. Means are provided to combine the signals from the output transducers. In encoded form, elements of the two output arrays are selectively disabled to provided an output from elements at like points from only one of the two output transducers. More particularly, output transducers are formed from spaced interdigitated pairs of bit taps, each comprising metalized fingers extending transversely from two parallel conducting bars. Selected taps of the transducer, one set from each pair, may then be disabled by severing metalized fingers of like polarity from their common conductor bar. When the transducer is energized, reversals of polarity in the output signal are present in coding, depending upon the pattern of the disabled sets.

In one aspect of the invention, electrode arrays are provided having two separate transducer bit patterns for each phase alternative of a phase coded SWD, one of which is disabled.

DESCRIPTION OF THE DRAWINGS

For a more complete understanding of the present invention and for further objects and advantages thereof, reference may now be had to the following description taken in conjunction with the accompanying drawings in which:

FIG. 1 is a functional block diagram of a label system embodying the present invention;

FIG. 2 is a detailed perspective view of the phase-coded SWD of FIG. 1; and

FIGS. 3a–3c illustrate an impulse response diagram of the SWD of FIGS. 1 and 2.

DESCRIPTION OF PREFERRED EMBODIMENTS

FIGURE 1

Referring to FIG. 1, a polyphase phase-shift-keyed (PSK) surface wave device (SWD) 10 is shown inter-

What is claimed is:

1. An acoustic surface wave programmable processor comprising:
   substrate means having at least a surface layer of piezoelectric material,
   means to produce respective first and second acoustic surface waves of opposite phase wherein the second acoustic surface wave is at least substantially the inverse of the first acoustic surface wave in the piezoelectric material of said substrate means and propagating along two distinct paths,
   a first output transducer array having a plurality of sets of electrode elements on the piezoelectric surface of said substrate means and disposed in the first path for sampling the first acoustic surface wave to be propagated therein at spaced time points corresponding to said sets of electrode elements along said first path,
   a second output transducer array having a plurality of sets of electrode elements on the piezoelectric surface of said substrate means and disposed in the second path for sampling the second acoustic surface wave to be propagated therein at spaced time points differing from the spaced time points in said first path at which the first acoustic surface wave to be propagated is sampled by said first output transducer array, and
   means operably connected to said first and second output transducer arrays for combining respective electrical output signals from sets of electrode elements at successive time points along said first and second paths from said first and second output transducer arrays.

2. An acoustic surface wave programmable processor as set forth in claim 1, wherein said means to produce respective first and second acoustic surface waves comprises a pair of input transducers positioned on the piezoelectric surface of said substrate means in a side by side relationship and having a common input channel to generate said first and second acoustic surface waves along said first and second paths.

3. An acoustic surface wave programmable processor comprising:
   substrate means having at least a surface layer of piezoelectric material,
   means to produce respective first and second acoustic surface waves of opposite phase wherein the second acoustic surface wave is at least substantially the inverse of the first acoustic surface wave in the piezoelectric material of said substrate means and propagating along two distinct paths,
   a first output transducer array having a plurality of sets of electrode elements on the piezoelectric surface of said substrate means and disposed in the first path for sampling the first acoustic surface wave to be propagated therein at spaced time points corresponding to said sets of electrode elements along said first path,
   a second output transducer array having a plurality of sets of electrode elements corresponding to like sets of electrode elements of said first output transducer array, said second output transducer array being positioned on the piezoelectric surface of said substrate means and disposed in the second path for simultaneously sampling the second acoustic surface wave to be propagated in said second path at spaced time points in said second path corresponding to said sets of electrode elements of said second output transducer array,
   electrode elements of said first and second output transducer arrays being selectively disabled to provide respective electrical output signals from sets of electrode elements at each pair of like time points from only one of said first and second output transducer arrays, and
   means operably connected to said first and second output transducer arrays for combining the electrical output signals from said first and second output transducer arrays.

4. A programmable acoustic surface wave device which comprises:
   substrate means having at least a surface layer of piezoelectric material,
   a plurality of input transducers arranged on the piezoelectric surface of said substrate means in parallel array pairs, each input transducer of each pair being effective to generate an acoustic surface wave opposite in phase and at least substantially the inverse of the acoustic surface wave generated by the other input transducer of each pair, with the acoustic surface waves to be generated by the input transducers of each pair being propagated along two distinct paths, and each input transducer having separated sets of interdigitated fingers,
   a plurality of output transducers arranged on the piezoelectric surface of said substrate means in parallel array pairs, each array pair of output transducers having one output transducer in each path of acoustic surface waves to be propagated from a corresponding one of said array pairs of input transducers, with each output transducer of each pair corresponding to a single phase alternative of the acoustic surface waves being propagated opposite in phase to that of the other output transducer and each having sets of separated interdigitated fingers,
   input electrode paths interconnecting said plurality of input transducers to provide predetermined acoustic surface waves of phase relationships in said device, and
   output electrode paths interconnecting said plurality of output transducers to produce a combined electrical output signal with electrical output signals from sets of interdigitated fingers of each pair of output transducers connected to produce electrical output signals of opposite polarity.

5. A programmable acoustic surface wave device as set forth in claim 4, wherein said sets of separated interdigitated fingers of one output transducer correspond to like sets of separated interdigitated fingers of the other output transducer of each pair, and
   selected sets of interdigitated fingers of each of said plurality of output transducers being disabled to effect phase reversals in a coded electrical output signal from said output transducers in response to an electrical signal applied to said input electrode paths.

6. In a phase coded system having a signal receiving circuit, and a signal recognition means, the combination comprising:
   substrate means having at least a surface layer of piezoelectric material,
   a pair of input transducers on the piezoelectric surface of said substrate means and providing parallel arrays of input transducer electrodes polarized to generate respective first and second acoustic surface waves of opposite phase wherein the second acoustic surface wave is at least substantially the inverse of the first acoustic surface wave, said pair of input transducers being placed in electrical communication with said receiving circuit for accepting input electrical signals therefrom, a pair of output transducers disposed on the piezoelectric surface of said substrate means and being respectively located in the paths of the first and second acoustic surface waves to be generated by excitation of said input transducers, said pair of output transducers providing parallel arrays of output transducer electrodes arranged in plural separated sets of interdigitated fingers forming plural signal taps along the extents of said pair of output transducers, sets of said interdigitated fingers of said pair of output transducers from only one of said pair of output transducers at each one of said plural signal taps providing respective electrical output signals from said pair of output transducers, and means operably connected to said pair of output transducers and to said signal recognition means for combining the electrical output signals produced by said output transducers in response to an electrical signal received by said pair of input transducers from said receiving circuit as a coded signal for input to said signal recognition means.

7. In a phase coded system as set forth in claim 6, wherein said plural signal taps of one of said pair of output transducers correspond to like signal taps of the other output transducer, and selected sets of said interdigitated fingers of each of said pair of output transducers being disabled in providing respective electrical output signals at each corresponding pair of signal taps from a single signal tap of one of said pair of output transducers.

8. A method of producing phase shift keyed acoustic surface wave devices, which comprises:

forming a pair of input transducers and a corresponding pair of output transducers along two acoustic surface wave propagation paths on a piezoelectric surface of a substrate, wherein the pair of output transducers include corresponding sets of interdigital electrodes forming plural pairs of signal taps, and disabling a selected one of each of the pairs of signal taps to provide a single operable signal tap of one or the other of said pair of output transducers from each pair of signal taps to effect phase reversals in an electrical output signal obtained from said pair of output transducers corresponding to a sequence of binary code information.

9. A method of producing phase shift keyed acoustic surface wave devices, which comprises:

forming a pair of input transducers on the piezoelectric surface of a substrate having arrays of input transducer electrodes so arranged to generate respective first and second acoustic surface waves of opposite phase wherein the second acoustic surface wave is at least substantially the inverse of the first acoustic surface wave along two acoustic surface wave propagation paths, forming a pair of output transducers on the piezoelectric surface of the substrate and located in the paths of the first and second acoustic surface waves to be generated by said input transducers, wherein the pair of output transducers includes corresponding plural signal taps of sets of interdigital electrodes, and disabling a selected one of said signal taps of each pair of corresponding signal taps included in said pair of output transducers so as to provide respective electrical output signals at each corresponding pair of signal taps from only one of said pair of output transducers to effect phase reversals in said electrical output signals corresponding to a sequence of binary code information.

10. A method as set forth in claim 9, wherein the selected signal tap of each pair of signal taps is disabled by severing interdigital electrodes of like polarity from a common conductor bar of one of said pair of output transducers.

11. A method of phase coding a surface wave device comprising:

forming a sequence of electrodes on a piezoelectric surface of a substrate to define a plurality of input transducer bit arrays and a plurality of output transducer bit arrays arranged in parallel, with a first pair of input and output transducer bit arrays corresponding to a single phase alternative signal in propagating and converting a respective acoustic surface wave to an electrical output signal, and a second pair of input and output transducer bit arrays corresponding to a single phase alternative signal in propagating and converting a second acoustic surface wave to an electrical output signal wherein the second acoustic surface wave is at least substantially the inverse of the first acoustic surface wave, and with the output transducer bit arrays provided with respective separated groups of interdigitated electrode fingers forming a plurality of corresponding signal taps.

disabling selected signal taps from said first and second output transducer bit arrays to code the surface wave device, and combining electrical output signals from said first and second output transducer bit arrays to form a phase-shift-keyed signal.

12. A method of phase coding a surface wave device as set forth in claim 11, wherein selected signal taps are disabled by severing electrode fingers of like polarity from a common conductor bar of one or the other of the first and second output transducer bit arrays.

* * * * *